United States Patent
Iwasaki et al.

[11] Patent Number: 6,114,672
[45] Date of Patent: Sep. 5, 2000

[54] PTC-ELEMENT, PROTECTIVE DEVICE AND ELECTRIC CIRCUIT BOARD

[75] Inventors: Norikazu Iwasaki, Tochigi; Hisaya Tamura, Kanuma; Toyoji Yamazaki, Utsunomiya; Yukio Yamada, Kanuma, all of Japan

[73] Assignee: Sony Corporation, Tokyo, Japan

[21] Appl. No.: 09/167,140

[22] Filed: Oct. 6, 1998

[30] Foreign Application Priority Data

Oct. 7, 1997 [JP] Japan ................................ 9-274657

[51] Int. Cl.$^7$ ........................................... H05B 1/02
[52] U.S. Cl. ..................... 219/505; 219/548; 219/511; 361/106
[58] Field of Search ..................... 219/504, 505, 219/506, 511, 528, 548, 553; 337/107, 290, 297; 392/451, 485; 429/7, 53; 338/22 R; 361/106

[56] References Cited

U.S. PATENT DOCUMENTS

| | | | |
|---|---|---|---|
| 4,017,715 | 4/1977 | Whitney et al. | 219/553 |
| 4,400,614 | 8/1983 | Sopory | 219/528 |
| 4,552,688 | 11/1985 | Sakamoto et al. | |
| 4,591,700 | 5/1986 | Sopory | 219/505 |
| 4,780,598 | 10/1988 | Fahey et al. | |
| 4,859,836 | 8/1989 | Lunk et al. | 219/548 |
| 4,910,389 | 3/1990 | Sherman et al. | 219/548 |
| 5,072,327 | 12/1991 | Knollman et al. | 361/106 |
| 5,093,898 | 3/1992 | Van Konynenburg | 392/451 |
| 5,416,462 | 5/1995 | Demarmels et al. | |
| 5,712,610 | 1/1998 | Takeichi et al. | 337/290 |
| 5,841,617 | 11/1998 | Watkins et al. | 361/106 |
| 5,939,217 | 8/1999 | Tamura et al. | 429/7 |

FOREIGN PATENT DOCUMENTS

| 0 235 454 | 9/1987 | European Pat. Off. |
| 0 484 138 | 5/1992 | European Pat. Off. |

*Primary Examiner*—Teresa Walberg
*Assistant Examiner*—L Fastovsky
*Attorney, Agent, or Firm*—Flynn, Thiel, Boutell & Tanis, P.C.

[57] ABSTRACT

A PTC-element to be used as a protective device against overcurrent or overvoltage, of which the volume resistivity does not substantially differ before and after a high temperature processing, such as reflowing of solder, and can be preserved even after having been subjected to repeated tripping, which contains a non-conductive crystalline polymer and a particulate conductor material dispersed in the non-conducting crystalline polymer, wherein the particulate conductor material includes electro-conductive particles having irregular surface contours.

17 Claims, 5 Drawing Sheets

PTC-ELEMENT, PROTECTIVE DEVICE AND ELECTRIC CIRCUIT BOARD

FIELD OF THE INVENTION

The present invention relates to a Positive Temperature Coefficient element (hereafter abbreviated as PTC-element) having a positive temperature coefficient of electrical resistance, especially a PTC-element usable as a protective device for protecting against overcurrent, overvoltage and other phenomena involving heat evolution, as well as to a protective, device and electric circuit board using this PTC-element.

BACKGROUND OF THE INVENTION

A PTC-element, also called a PTC-thermistor, has a positive temperature coefficient of electrical resistance, wherein the electrical resistance thereof increases as the temperature is elevated, and is used as a protective device for protecting against overcurrent, overvoltage and other phenomena involving heat evolution. Currently used PTC-elements are is composed of a matrix of a non-conductive crystalline polymer and dispersed therein, an electroconductive particulate material. The electrical resistance of such a PTC-element is low at lower temperatures since the particles of the conductor material are held in contact with each other at lower temperatures. However, when the temperature is elevated, the electric resistance increases by the possible occurrence of the separation of the particles of the conductor from their contact with each other due to the thermal expansion of the non-conductive crystalline polymer and reaches finally a current shutoff.

As PTC-elements of the prior art, there have been proposed, for example, those in which spherical carbon particles, in particular, a perfect spherical shape, are used for the conductor material (Japanese Patent Application Laid-open Hei-8-298201 A) and those in which the spherical carbon particles above are each provided with a surface coating layer of metal (Japanese Patent Application Laid-open Hei-8-172001 A).

Those PTC-elements using a spherical particulate conductor material are said to have a low volume resistivity, a high electrical resistance at the peak and a capability of a steep increase in resistance within a narrow range of temperature.

Upon mounting such a conventional PTC-element on the surface of an electric circuit board, however, a problem is brought about in which the initial volume resistivity of the PTC-element is, in some cases, set at a high value due to a possible temperature elevation upon the assemblage thereof, when a high temperature processing, such as a reflowing treatment of the solder, is employed, whereby its use as an assembled PTC-element becomes difficult.

SUMMARY OF THE INVENTION

An object of the present invention is to provide a PTC-element having a low volume resistivity, a high electrical resistance at the peak, a capability of an abrupt elevation of the electrical resistance within a narrow temperature range, a low initial value of the volume resistivity, even after having been subjected to a high temperature processing such as a reflowing treatment of the solder, and a capability of preserving the low volume resistivity after repeated trippings.

Another object of the present invention is to provide a protective device using the PTC-element mentioned above.

A further object of the present invention is to provide an electric circuit board equipped with such a protective device as mentioned above.

The PTC-element according to the present invention comprises a non-conductive crystalline polymer and a particulate conductor material dispersed in the non-conductive crystalline polymer, wherein the conductor material comprises electroconductive particles having irregular surface contours.

The protective device according to the present invention comprises a PTC-element comprising a non-conductive crystalline polymer and a particulate conductor material dispersed in the non-conductive crystalline polymer, wherein the conductor material comprises electroconductive particles having irregular surface contours, a heating element for transmitting heat to the a detecting element for detecting any abnormal condition and flowing a current through the heating element when detected.

The electric circuit board according to the present invention comprises, installed therein, a protective device which comprises a PTC-element comprising a non-conductive crystalline polymer and a particulate conductor material dispersed in the non-conductive crystalline polymer, wherein the conductor material comprises electroconductive particles having irregular contours, a heating element for transmitting heat to the PTC-element and a detecting element for detecting any abnormal condition and flowing a current through the heating element when detected.

DETAILED DESCRIPTION OF THE INVENTION

Figure 1:
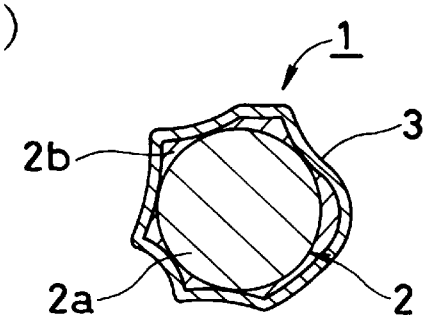
FIG. 1(a) illustrates a particle of the particulate conductor material according to the present invention in a schematic cross-sectional view.
FIG. 1(b) illustrates an embodiment of the PTC-element according to the present invention in a schematic longitudinal cross-sectional view.
Figure 1:
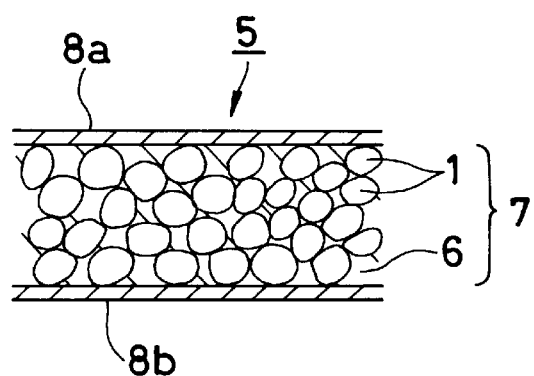

Any conventional polymer can be used for the crystalline polymer according to the present invention without limitation, as far as they are organic polymers which are non-conductive and can expand as the temperature increases, wherein preference is given, in particular, to those which can expand abruptly within a narrow temperature range. For these crystalline polymers, there may be enumerated, for example, polyolefins, such as polyethylene and polypropylene, and polycaprolactone, wherein preferred are polyethylene and ethylene/methacrylate copolymers.

The particulate conductor material according to the present invention may be composed of microspherical particles of an electroconductive substance provided on each particle with irregular surface contours, wherein the shape of the base particle is a sphere, preferably a perfect sphere, on which micronous irregular contours are formed. The particle size may range between 5 and 50 μm, preferably between 10 and 40 μm. The height of the protrusions of the surface irregularity may range between 0.01 and 10 μm, preferably between 0.1 and 1 μm, corresponding to a proportion in the range of 1/5 to 1/1,000, preferably 1/10 to 1/100, relative to the particle size. The specific weight of the particle may be in the range from 2 to 5, preferably from 2 to 3.5.

It is permissible to use for the conductor material, without any special limitation, every electroconductive particulate material, for example, metals, such as silver and others, carbon and so on. From the view point of facilitation production and so on, a preferred material is particulate carbon, especially particulate graphite, or one in which each particle of graphite is coated with a layer of a metal by, for example, plating. For the metal of the coating layer, for example, gold, silver, copper and nickel may be enumerated. Gold is preferable, while a double-layered coating of nickel/gold is more preferable in view of better adhesion on the base particle of carbon.

The carbon particles having irregular surface contours may be produced by forming on each spherical particle of a particulate thermosetting resin or a carbonized product thereof, irregular surface contours by pitch-coating or the like and subjecting the resulting particles to carbonization, while another method may also be employed for producing the carbon particles having irregular surface contours, for example, a method in which each of the spherical carbon particles is coated with a layer of carbon powder.

For forming a metal layer over the surface of the carbon particle having irregular surface contours, physical methods including vacuum deposition, ion plating and thermal spraying may be employed, wherein preference is given to plating techniques, such as electrolytic plating and currentless plating. For the material to be plated, nickel and gold are preferred. The thickness of the metal layer may vary in accordance with each specific technique used, while it may range favorably between 0.02 and 0.2 μm, in particular, between 0.1 and 0.15 μm.

The PTC-element according to the present invention is one in which a kneaded mixture containing the particles of the conductor material dispersed in the matrix consisting of the non-conductive crystalline polymer is arranged between the electrodes. The proportion of the particulate conductor material relative to the total mixture may be in the range from 25 to 60%, preferably from 40 to 50%, on the volume basis. No satisfactorily low initial value for the volume resistivity can be obtained at a proportion of the particulate conductor material lower than 25% by volume and, on the other hand, the PTC-element exhibits no satisfactory material properties at a proportion of the particulate conductor material higher than 60% by volume.

The PTC-element according to the present invention may contain, in addition to the crystalline non-conductive polymer and the particulate conductor material, other ingredients, such as a heat resistance stabilizer, a weathering stabilizer and so on.

The PTC-element according to the present invention can be produced by mixing the crystalline non-conductive polymer and the particulate conductor material together with the optionally incorporated additional ingredients, kneading the resulting premix in a molten state and subjecting the kneaded mass to forming, so as to permit the formed product to be disposed between the electrodes. It is possible to prepare the PTC-element in the form of an integrated unit with the electrodes by press molding the kneaded mass together with two metal foils which serve as the electrodes fitted to the kneaded mass.

The volume resistivity of the PTC-element according to the present invention obtained in the manner as above does not exceed over $1 \times 10^{-1}$ Ω cm before and after the reflowing treatment of solder and such a low volume resistivity can be preserved even after repeated tripping thereof. Therefore, the PTC-element according to the present invention is suitable to serve as a protective element to be assembled on an electric circuit board which is subjected to a reflowing treatment of the solder, though it finds, of course, a general protective element for usual purposes.

The PTC-element according to the present invention has a positive temperature coefficient of electrical resistance. At lower temperatures, the particles of the conductor material are held in contact with each other, whereby the electroconductivity of the PTC-element is secured and the volume resistivity thereof is kept low. However, at higher temperatures, especially within a certain specific temperature range, an abrupt expansion of volume of the non-conductive crystalline polymer takes place, whereby the particles of the conductor material separate from each other, resulting in an abrupt increase in the volume resistivity of the element to thereby cause tripping of the PTC-element and to bring about a current shutoff.

The PTC-element according to the present invention can, thus, be used as a protective element having a function of detecting any abnormal condition caused from heat evolution in an electrical system due to an overcurrent or overvoltage or due to an abnormal electrode reaction in a battery and causing shutoff of the current.

The tripping temperature of the PTC-element according to the present invention can be adjusted in a similar way as in a conventional PTC-element by, for example, selecting each specific non-conductive crystalline polymer and the proportion of the amount of particulate conductor material relative to the non-conductive crystalline polymer.

The protective device according to the present invention is constructed from the PTC-element mentioned above, a heating element for transmitting a Joule's heat to the PTC-element and a detecting element for detecting any abnormal condition and causing a current to flow through the heating element. The heating element is arranged in the protective device according to the present invention in such a manner that the PTC-element and the heating element are held in a thermally joined state under interposition of an electric insulator therebetween. One or more PTC-elements may be incorporated in one single protective device. The detecting element is arranged to reliably detect any abnormal condition and to cause a current to flow through the heating element when detected. As the detecting element, for example, a voltage detecting element may be employed by connecting it so as to detect an overvoltage and to cause a current to flow through the heating element when an overvoltage is detected.

In the above-mentioned protective device, the heating element is actuated upon detection of an abnormal condition, such as an overvoltage, by the detecting element to develop a Joule's heat which is transmitted to the PTC-element to cause tripping thereof, resulting in a current shutoff. The principle of the function of the protective device is as above. In a protective device using a detecting element based on the detection of an overvoltage, the current shutoff of the PTC-element is actuated by an overvoltage to effect the protecting function.

The PTC-element or the protective device given above can be mounted on an electric circuit board together with other constituent circuit elements in order to obtain an electric circuit board assembly equipped with the PTC-element or the protective device. Here, the PTC-element will not be obstructed by a possible high temperature processing by, such as reflowing of the solder, and the proper function thereof is maintained.

The electric circuit board according to the present invention is provided with a protective device described above which is composed of the above-mentioned PTC-element, a heating element and a detecting element. This electric circuit board can be actuated even in the event of such an abnormal condition as an overdischarge or overvoltage other than heat evolution, by detecting it and causing a current to flow through the heating element so as to effect tripping of the PTC-element. For instance, when an overvoltage appears in the charging circuit of a storage battery at the end of the charging operation or when an overdischarge appears in the output line of a battery or cell due to an abnormal electrode reaction, it is detected by the detecting element which causes the heating element to actuate, whereby tripping of the PTC-element is brought about.

As described above, the PTC-element according to the present invention incorporates microspherical conductive particles with irregular surface contours as the particulate conductor material dispersed in the matrix of the non-conductive crystalline polymer. It is made possible thereby to obtain a PTC-element having a low volume resistivity at lower temperatures, a high resistance at the peak and a capability of causing an abrupt increase in the volume resistivity within a narrow temperature range with the assurance of a low volume resistivity, even after having been subjected to a high temperature heat treatment, such as the reflowing of solder, together with the preservation of a low volume resistivity, even after repeated trippings thereof.

It is easy to fabricate a PTC-element having a low initial volume resistivity when carbon particles having irregular surface contours are employed for the above-mentioned microspherical particles with irregular surface contours. Appropriate irregular surface contours may be attained by, in particular, using carbon particles having surface irregularities obtained by pitch-coating on the basal carbon particles.

When a particulate conductor material provided on the surface of each particle with a metal layer is employed, a PTC-element exhibiting a low volume resistivity upon current conduction can be obtained. When a particulate conductor material obtained by coating carbon particles having irregular surface contours with a metal layer is employed, a PTC-element exhibiting a low volume resistivity upon current conduction can be obtained in an easy and economic way.

The protective device according to the present invention comprises the PTC-element(s) described above, the heating element(s) and the detecting element in combination. It functions to protect a current-conducting apparatus or system by detecting an abnormal condition, such as an overvoltage, overcurrent or the like, which is not able to be detected by using only the PTC-element. Here also, the initial volume resistivity remains low after having been subjected to a high temperature processing, such as reflowing of the solder, and is preserved even after repeated trippings of the PTC-element.

Since the electric circuit board according to the present invention is provided with the above-described PTC-element(s) or protective device, the volume resistivity of the so-assembled PTC-element(s) will not differ from the initial low value after having been subjected to a high temperature processing by reflowing of the solder upon the assemblage and can be preserved for a long term under the operation of the circuit with repeated trippings of the PTC-element(s).

THE BEST MODE FOR EMBODYING THE INVENTION

Below, the present invention will further be described in more detail by way of embodiments thereof with reference to the appended Drawings.

FIG. 1(a) illustrates a typical particle of the particulate conductor material coated with a metal layer according to the present invention in a schematic cross-sectional view. FIG. 1(b) shows schematically the PTC-element in a cross-sectional view.

As shown in FIG. 1(a), the particle of the conductor material 1 comprises a microspherical carbon particle 2 having irregular surface contours and which is coated with a metal layer 3. The irregular contour of the carbon particle 2 is obtained by providing a layer having irregular protrudings 2b on a base particle 2a of a nearly perfect spherical shape by a pitch-coating with subsequent carbonization. The metal layer 3 is plated over the entire surface of the carbon particle 2 by plating first with nickel and then with gold thereon to form a double layered metal coating, though only a single layer is shown in the Drawing. The metal layer is shown here in an enlarged thickness for easier viewing.

In FIG. 1(b), the PTC-element 5 is shown in a construction in which two electrodes 8a and 8b, each consisting of a metal foil, are attached to both sides of a solid mass 7 composed of a non-conductive matrix of the crystalline polymer 6 and the particulate conductor material 1 dispersed in the matrix.

The PTC-element 5 is formed as an integrated unit which is produced by kneading the crystalline polymer 6 together with the particulate conductor material 1 into a heterogeneous mixture 7, placing the mixture 7 in between two electrodes 8a and 8b each consisting of a metal foil, press-molding the mixture together with the electrodes attached thereto into a molded product and cutting this molded product into the integrated unit of a predetermined size.

The so-obtained PTC-element 5 can serve for a practical use by inserting it in a detecting or protecting circuit by connecting the electrodes 8a and 8b to the circuit. At lower temperatures, the particles of the particulate conductor material are held in contact with each other to assure electroconductance therethrough, whereas they separate from each other by expansion of the non-conductive crystalline polymer 6 when heated and the volume resistivity of the PTC-element 5 reaches a high value within a narrow temperature range and, at last, the tripping thereof will occur.

The PTC-element 5 can be used as a detecting element when it is used for observing and displaying the volume resistivity value of the PTC-element, or can be used as a protective element against heat evolution, when it is used for controlling or cutting off the electric current to the heating element. The PTC-element 5 can also serve as a detecting or protecting element against the occurrence of an overcurrent, since the resistance thereof increases when it is heated by the overcurrent.

Figure 2:
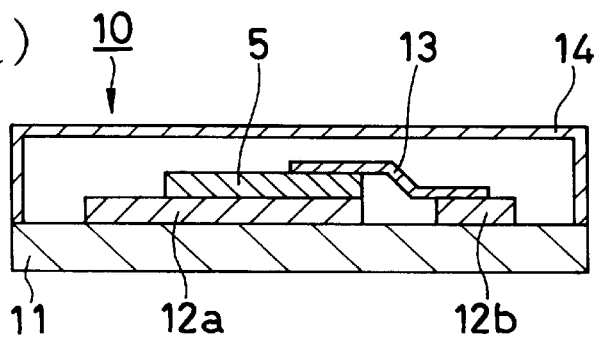
FIGS. 2(a) and 2(b) show an embodiment of the protective element according to the present invention in a schematic vertical cross-sectional view and in a schematic plan view with exclusion of its coverplate, respectively.
Figure 2:
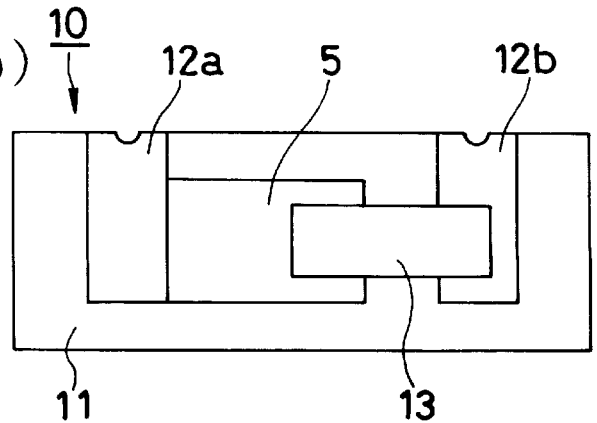

One embodiment of the protective device according to the present invention is shown in FIGS. 2(a) and 2(b) in a schematic vertical cross-sectional view and in a schematic plan view with a removed cover plate, respectively.

In FIGS. 2(a) and 2(b), the protective element is indicated by the numeral 10 and the electrodes therefor 12a and 12b are disposed on a substrate board 11. The PTC-element 5 is attached to one of the electrodes (12a) so as to connect it to one of the electrodes (8b) of the PTC-element 5, while the other electrode 8a of the PTC-element 5 is connected with the other electrode 12b of the protective element 10 on the board 11 by a metal foil 13 bridging therebetween. The entire protective element is covered by a cap 14.

The substrate board 11 is made of an insulating material, for example, a glass fiber-reinforced epoxy resin, on which the electrodes 12a and 12b, each made of, for example, a metal foil of copper or the like, are disposed. The electrodes 8a and 8b of the PTC-element 5, the electrodes 12a and 12b of the protective element 10 and the metal foil 13 are mounted by reflowing the solder.

The protective element 10 may be disposed close to the heating element for transmitting heat to the PTC-element in order to attain tripping of the PTC-element due to an increase in the volume resistivity thereof by being heated by the transmitted heat to cause a current shut off, whereby the current conducting apparatus or system provided with the protective device according to the present invention can reliably be protected.

Figure 3:
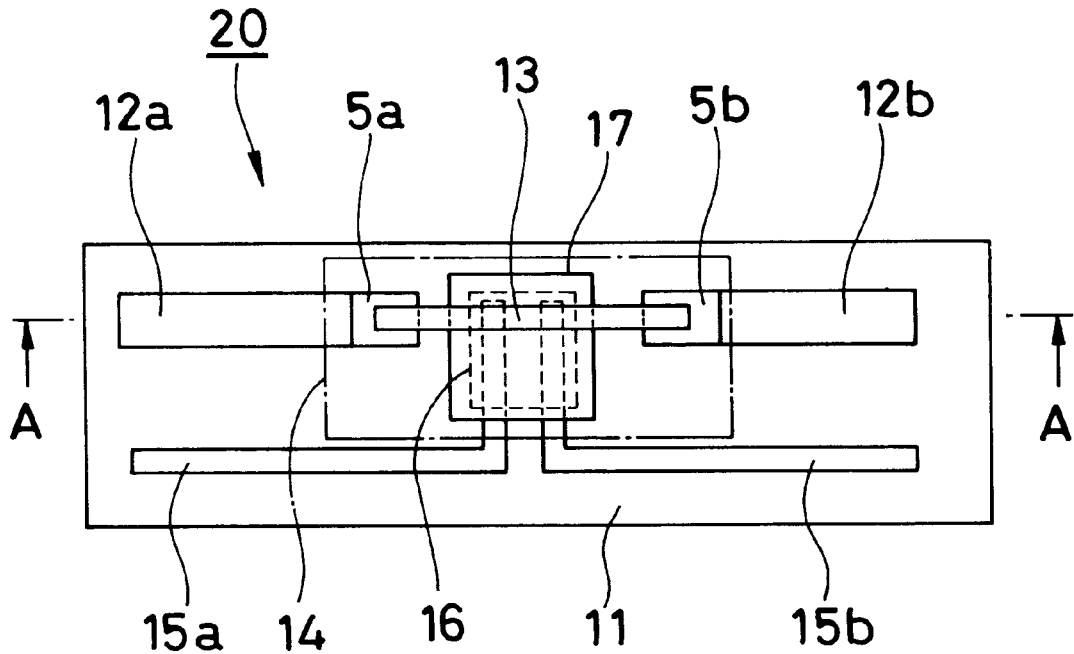
FIGS. 3(a) and 3(b) show an embodiment of the electric circuit board according to the present invention in a plan view and in a vertical cross sectional view along the line A—A of the former, respectively.
Figure 3:
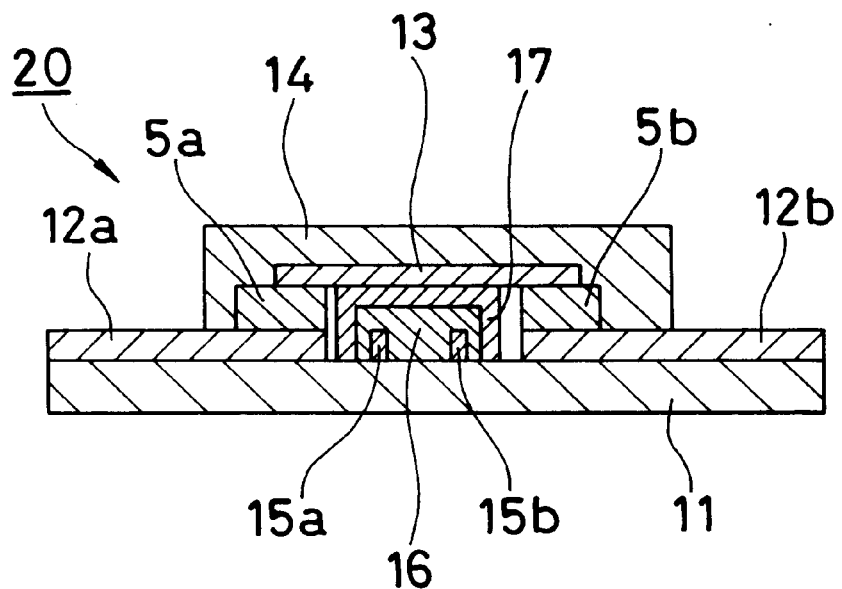

In FIGS. 3(a) and 3(b), an embodiment of the electric circuit board according to the present invention is shown in a schematic plan view and in a schematic vertical cross-sectional view along the line A—A of the former, respectively.

In the electric circuit board 20, the electrodes 12a and 12b for the PTC-elements and the electrodes 15a and 15b for the heating element 16 are arranged on the substrate board 11 as patterned conductor segments. The electrodes 12a and 12b for PTC-elements are connected to the PTC-elements 5a and 5b and a metal foil 13 is disposed to connect the PTC-elements by bridging between them, so as to build up the protective element. A heating element 16 is arranged between the PTC-elements 5a and 5b so as to hold an electric connection with the electrodes 15a and 15b for the heating element but is insulated from other elements by being surrounded by an insulator 17. The entire protective element is covered by a cap or sealing member 14.

The electrodes 12a and 12b, the PTC-elements 5a and 5b and the metal foil 13 in the electric circuit board 20 are interconnected with solder by reflowing of the solder.

In the electric circuit board 20, the PTC-elememts 5a and 5b trip when the heating element 16 becomes heated, whereby the current through the electrodes 12a and 12b becomes reduced.

Figure 4:
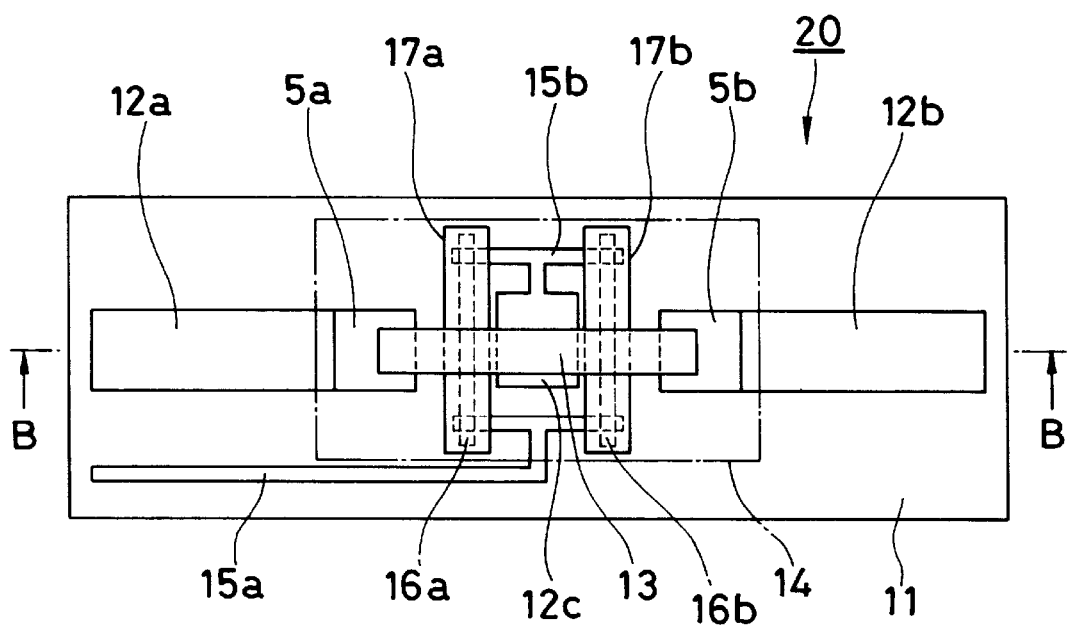
FIGS. 4(a) and 4(b) show another embodiment of the electric circuit board according to the present invention in a plan view and in a vertical cross sectional view along the line B—B of the former, respectively.
Figure 4:
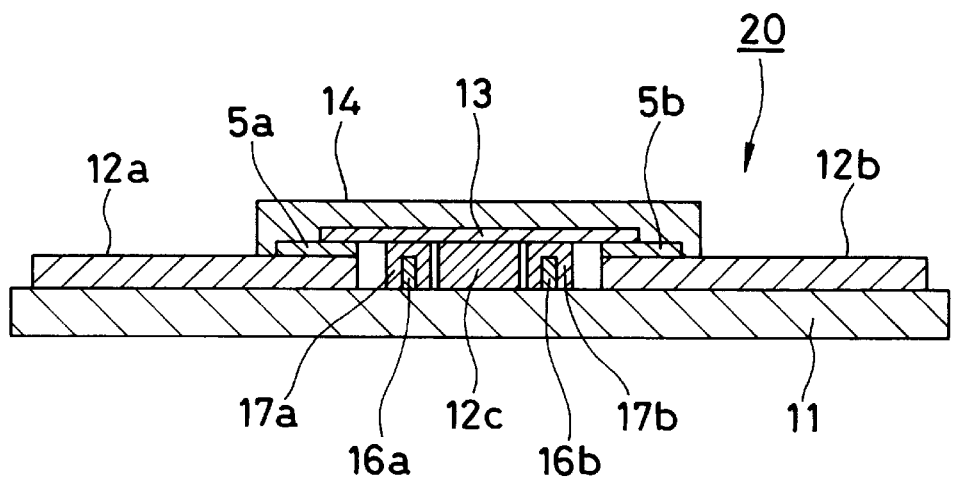

FIG. 4(a) shows an alternative embodiment of the electric circuit board according to the present invention in a schematic plan view. FIG. 4(b) shows the embodiment of FIG. 4(a) in a schematic vertical cross-sectional view along the line B—B of the former. In this embodiment, an intermediate electrode 12c is disposed between the electrodes 12a and 12b for the PTC-elements in such a manner that the heating elements 16a and 16b are arranged separately so as to connect the intermediate electrode 12c with the electrode 12a or with the electrode 12b, respectively, wherein the PTC-element 5a and the PTC-element 5b are interconnected by a metal foil 13 via the intermediate electrode 12c.

The electrodes 12a, 12b and 12c, the PTC-elements 5a and 5b and the metal foil 13 in the above electric circuit board 20 are interconnected with solder by reflowing of the solder.

In the above electric circuit board 20, the PTC-elememts 5a and 5b trip when the heating elements 16a and 16b become heated, whereby the current through the electrodes 12a and 12b reduces, so that the protection of a current conducting apparatus or system employing this circuit board assembly can be attained by the reduction of heat evolution in the heating elements 16a and 16b due to the decreased current through the electrodes 15a and 15b.

Figure 5:
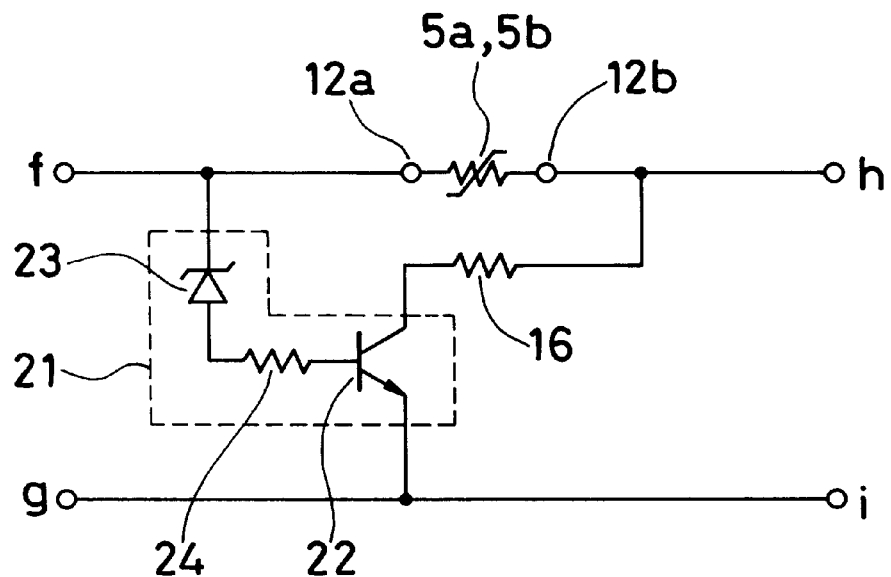
FIGS. 5(a) and 5(b) each give a circuit diagram for embodying, as a protective device, the electric circuit board shown in FIGS. 3(a), 3(b) or in FIGS. 4(a), 4(b), respectively.
Figure 5:
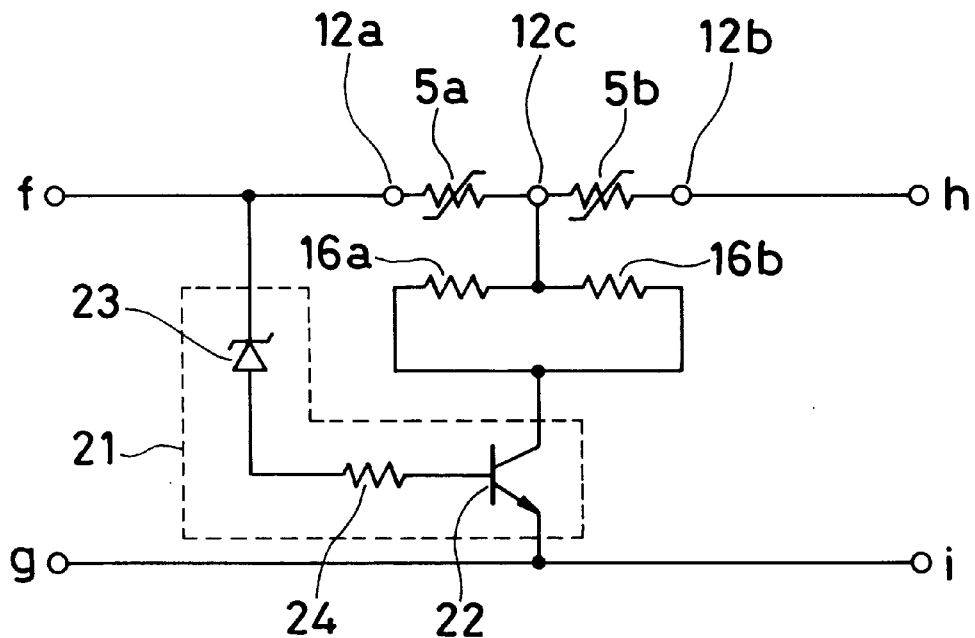

FIGS. 5(a) shows a circuit diagram embodying the electric circuit board shown in FIGS. 3(a) and 3(b) as the protective device according to the present invention. This protective device comprises PTC-elements 5a and 5b, a heating element 16 and a detecting element 21. In the arrangement of FIG. 5(a), the PTC-elements 5a and 5b, the heating element 16 and a transistor 22 of the detecting element 21 are connected in series between the terminals f and g, wherein a Zener diode 23 and a resistor 24 which constitute the detecting element 21 are interposed between the terminal f and the base of the transistor 22. Each of the constituent members of the detecting element 21 assembled in this electric circuit board 20 is not shown in FIGS. 3(a) and 3(b).

In the above protective device, a current begins to flow through the Zener diode 23 when an overvoltage imposed between the terminals f and g reaches the Zener voltage, whereby the transistor 22 is actuated to pass a current therethrough and through the heating element 16 to cause heat evolution. This Joule's heat is transmitted to the PTC-elements 5a and 5b via the metal foil 13 and causes an increase in the resistance thereof to effect tripping thereof to reach a current shutoff. Thus, the protective device of this embodiment can be used for protecting against an overvoltage in, for example, a charging circuit of a storage battery or the like.

FIG. 5(b) shows a circuit diagram embodying the electric circuit board shown in FIGS. 4(a) and 4(b) as a protective device according to the present invention. This protective device comprises PTC-elements 5a and 5b, heating elements 16a and 16b and a detecting element 21. In this embodiment, wiring is realized in the same manner as that in FIG. 5(a), except that the PTC-elements 5a and 5b and the heating elements 16a and 16b are separated by an intermediate electrode 12c.

In this protective device, the detecting element 21 will be actuated when an overvoltage occurs both in the case where the current conduction occurs on the side of the terminals f and g and in the case where the current conduction is effected through the terminals h and i, to thereby cause both the heating elements 16a and 16b to be heated by the Joule's heat, whereby both the PTC-elements are made to trip and effect shutoff of the current to the heating elements 16a and 16b. The protective device of this embodiment can thus be utilized in, for example, a charging circuit of a storage battery for protecting against overvoltage.

EXAMPLE

Below, the present invention will further be described in more detail by way of Examples.

Examples 1 and 2 and Comparative Examples 1 and 2

A particulate conductor material (Conductor 1 or Conductor 2) was prepared by processing a product of microspherical carbon particles of spherical particle form {CARBON MICROBEADS PC (trademark), a product of Nippon Carbon K. K.} by providing surface irregularities on each particle by means of pitch-coating (Examples 1 and 2), onto which a metal coating layer was applied by a currentless plating first with nickel and then with gold thereon. In Comparative Examples 1 and 2, the same procedures were pursued except that a product of microspherical carbon particles having the particle form of perfect spheres {CARBON MICROBEADS ICB (trademark), a product of Nippon Carbon K.K.} was employed to obtain the particulate conductor material (Conductor 3 and Conductor 4, respectively).

Conductor 1 a carbon product having a particle size of 5 μm with surface protrusions of an average height of 0.5 μm processed by pitch-coating and carbonization with a subsequent metal plating of Ni/Au with a Ni thickness of 0.092 μm and an Au thickness of 0.061 μm.

Conductor 2 a carbon product having a particle size of 10 μm with surface protrusions of an average height of 1.0 μm processed by pitch-coating with a subsequent metal plating of Ni/Au with a Ni thickness of 0.110 μm and an Au thickness of 0.064 μm.

Conductor 3 a carbon product having a particle size of 5 μm and a particle form a perfect sphere processed by metal plating of Ni/Au with a Ni thickness of 0.091 μm and an Au thickness of 0.061 μm.

Conductor 4 a carbon product having a particle size of 10 μm and a particle form of a perfect sphere processed by metal plating of Ni/Au with a Ni thickness of 0.110 μm and an Au thickness of 0.057 μm.

A high density polyethylene product (HDPE) (HIZEX 5000H (trademark), a product of Mitsui Petrochemical Ind., Ltd.) and an ethylene/ethyl acrylate copolymer (EEA) (NUC 6170 (trademark), a product of Nippon Unicar Co., Ltd.) were used for the non-conductive crystalline polymer. Each of the particulate conductor materials prepared as above and the above non-conductive crystalline polymer were blended in a proportion as shown in Table 1 by kneading in a press kneader at 190° C. and the resulting mass was press-molded in a hot press under a condition of 190° C., 0.49 MPa (5 kgf/cm²) for 20 sec. into a film having a thickness of 300 μm. This film was placed between two nickel foils and the resulting lamination was further processed by a hot press (190° C., 0.49 MPa, for 30 sec.) into a PTC-element having a thickness of 200 μm.

The initial volume resistivity of this PTC-element was observed. Using this PTC-element, a protective device was prepared by mounting it on a substrate board in a manner similar to that shown in FIG. 2 by incorporating a reflowing treatment of solder at a reflowing temperature of 250° C. The resulting protective device was examined for its volume resistivity after being subjected to the reflowing treatment, for the electrical resistance upon conduction of a overcurrent (10 A) and for the electrical resistance after repeating 100 cycles of current conduction at a current of 10 A. The results are summarized in Table 1.

TABLE 1

| | Example | | Compar. Example | |
|---|---|---|---|---|
| | 1 | 2 | 1 | 2 |
| Composition in Vol. % | | | | |
| Polyethylene | 34 | 34 | 34 | 34 |
| Ethylene/MMA copolymer | 18 | 18 | 18 | 18 |
| Conductor 1 | 48 | — | — | — |
| Conductor 2 | — | 48 | — | — |
| Conductor 3 | — | — | 48 | — |
| Conductor 4 | — | — | — | 48 |
| Resistance ($\Omega$ cm × $10^{-2}$) | | | | |
| Before reflow. | 5.5 | 4.3 | 4.9 | 5.5 |
| After reflow. | 7.2 | 5.9 | 20 | 13 |
| Overcurr. test | | | | |
| On conduction 10 A ($\Omega$ cm) | 3.0 × 10 | 3.0 × 10 | 2.9 × 10 | 3.3 × 10 |
| After 100 cyc. (On 6 sec. Off 54 sec.) 10 A ($\Omega$ cm) | $2.0 \times 10^{-1}$ | $8.0 \times 10^{-2}$ | $6.0 \times 10^{-1}$ | $2.0 \times 10^{-1}$ |

From Table 1, it is seen that both observed values of resistance before and after reflowing are lower (both at values below $1 \times 10^{-1}$) for the inventive Examples 1 and 2, as compared with those of Comparative Examples 1 and 2. Concerning the volume resistivity after 100 cycles of on-off tests, both the inventive Examples 1 and 2 resulted in lower values than those of Comparative Examples 1 and 2, wherein, in particular, the volume resistivity for Example 2 in which a particulate conductor material having a particle size of 10 μm was employed gave a lower value.

The above PTC-elements were mounted on a substrate board in a similar manner as shown in FIGS. 3(a) and 3(b) and the resulting circuit board was installed in an electric circuit in a similar manner as shown in FIG. 5(a) to prepare a protective device. Using this protective device, an on-off repeating test was carried out by imposing a voltage of 4.5 volts between the terminals of f and g with 5 minutes of "on" and 5 minutes of "off", the results of which are recited in FIG. 6 as a graphic illustration.

Figure 6:
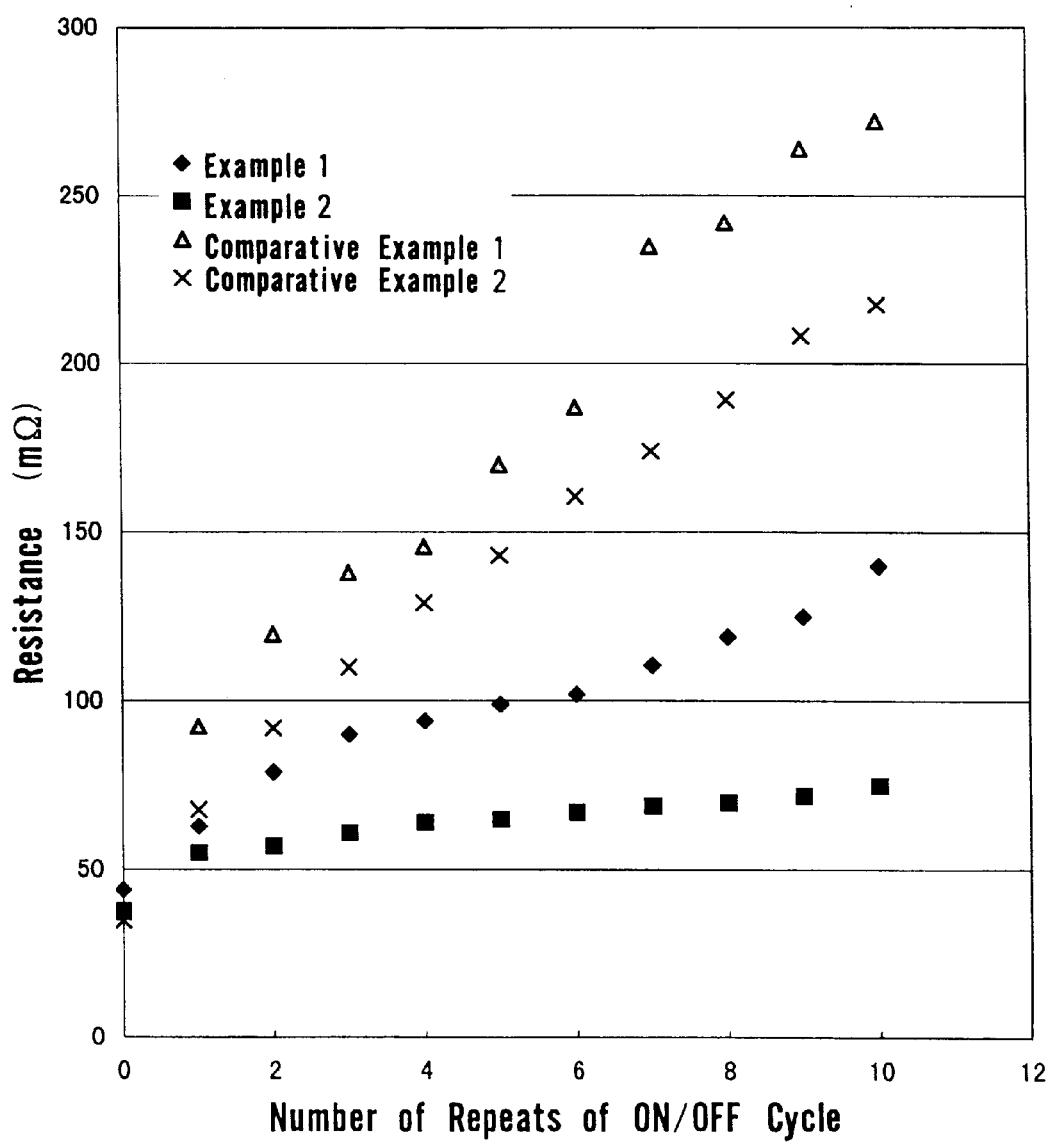
FIG. 6 is a graph representing the experimental results of the inventive Examples and Comparative Examples.

As seen in FIG. 6, the increase in the electric resistance is lower for inventive Examples 1 and 2 in which particulate conductor particles having surface irregularities are used, as compared with Comparative Examples 1 and 2. The increase in the resistance was found to be low in particular for Example 2 in which a particulate conductor material with a particle size of 10 μm was employed.

What is claimed is:

1. A PTC-element comprising a non-conductive crystalline polymer and a particulate conductor material dispersed in the non-conductive crystalline polymer, the conductor material comprising electroconductive particles having irregular surface contours and said electroconductive particles comprising microspherical carbon particles and a metal surface coating layer.

2. A PTC-element as claimed in claim 1, wherein the conductor material comprises microspherical carbon particles having surface irregularities formed by a surface coating and a metal surface coating layer.

3. A PTC-element as claimed in claim 1, wherein the volume resistivity of the PTC-element before and after a reflowing treatment does not exceed over a value of $1 \times 10^{-1}$ $\Omega$·cm.

4. A protective device comprising
a PTC-element comprising a non-conductive crystalline polymer and a particulate conductor material dispersed in the non-conductive crystalline polymer, wherein the conductor material comprises electroconductive particles having irregular surface contours,
a heating element for transmitting heat to the PTC-element and
a detecting element for detecting any abnormal condition and flowing a current through the heating element when detected.

5. A protective device as claimed in claim 4, wherein a plurality of the PTC-elements are provided.

6. A protective device as claimed in claim 4, wherein the detecting element is a voltage detecting element.

7. A protective device as claimed in claim 4, wherein the PTC-element and the heating element are held in a thermally joined state under interposition of an electric insulator.

8. An electric circuit board comprising, installed therein, a PTC-element comprising a non-conductive crystalline polymer and a particulate conductor material dispersed in the non-conductive crystalline polymer, wherein the conductor material comprises electroconductive particles having irregular surface contours.

9. An electric circuit board comprising, installed therein, a protective device which comprises
a PTC-element comprising a non-conductive crystalline polymer and a particulate conductor material dispersed in the non-conductive crystalline polymer, wherein the conductor material comprises electroconductive particles having irregular surface contours,
a heating element for transmitting heat to the PTC-element and
a detecting element for detecting any abnormal condition and flowing a current through the heating element when detected.

10. A PTC-element as claimed in claim 2, wherein the microspherical carbon particles have a particle size ranging between 5–50 $\mu$m and the surface coating forms surface irregularities having peaks with a height ranging between 0.01–10 $\mu$m.

11. A PTC-element as claimed in claim 10, wherein the microspherical carbon particles have a particle size ranging between 10–40 $\mu$m and the peaks have a height ranging between 0.1 and 1 $\mu$m.

12. A protective device as claimed in claim 4, wherein the electroconductive particles comprise microspherical carbon particles having a particle size ranging between 5–50 $\mu$m, a surface coating provided on said microspherical carbon particles and forming surface irregularities having peaks with a height ranging between 0.01–10 $\mu$m and a metal surface coating layer.

13. A protective device as claimed in claim 12, wherein the microspherical carbon particles have a particle size ranging between 10–40 $\mu$m and the peaks have a height ranging between 0.1 and 1 $\mu$m.

14. An electric circuit board as claimed in claim 8, wherein the electroconductive particles comprise microspherical carbon particles having a particle size ranging between 5–50 $\mu$m, a surface coating provided on said microspherical carbon particles and forming surface irregularities having peaks with a height ranging between 0.01–10 $\mu$m and a metal surface coating layer.

15. An electric circuit board as claimed in claim 14, wherein the microspherical carbon particles have a particle size ranging between 10–40 $\mu$m and the peaks have a height ranging between 0.1 and 1 $\mu$m.

16. An electric circuit board as claimed in claim 9, wherein the electroconductive particles comprise microspherical carbon particles having a particle size ranging between 5–50 $\mu$m, a surface coating provided on said microspherical carbon particles and forming surface irregularities having peaks with a height ranging between 0.01–10 $\mu$m and a metal surface coating layer.

17. An electric circuit board as claimed in claim 16, wherein the microspherical carbon particles have a particle size ranging between 10–40 $\mu$m and the peaks have a height ranging between 0.1 and 1 $\mu$m.

* * * * *

UNITED STATES PATENT AND TRADEMARK OFFICE
CERTIFICATE OF CORRECTION

PATENT NO. : 6,114,672
DATED : September 5, 2000
INVENTOR(S) : Norikazu IWASAKI et al It is certified that error appears in the above-identified patent and that said Letters Patent is hereby corrected as shown below:

At [73] on the face of the Patent,
    change "Sony Corporation" to ---Sony Chemicals Corporation---.

Signed and Sealed this

Fifth Day of June, 2001

*Attest:*

NICHOLAS P. GODICI

*Attesting Officer*

*Acting Director of the United States Patent and Trademark Office*